United States Patent
Ritter

(10) Patent No.: US 10,317,479 B2
(45) Date of Patent: Jun. 11, 2019

(54) SENSOR UNIT AND METHOD FOR DETECTING AN ENCODER AT A PREDEFINED POSITION

(71) Applicant: TDK—Micronas GmbH, Freiburg (DE)

(72) Inventor: Joachim Ritter, Loerrach (DE)

(73) Assignee: TDK—Micronas GmbH, Freiburg (DE)

( * ) Notice: Subject to any disclaimer, the term of this patent is extended or adjusted under 35 U.S.C. 154(b) by 114 days.

(21) Appl. No.: 15/668,031

(22) Filed: Aug. 3, 2017

(65) Prior Publication Data

US 2018/0038920 A1   Feb. 8, 2018

(30) Foreign Application Priority Data

Aug. 3, 2016  (DE) .................. 10 2016 009 353

(51) Int. Cl.
  *G01R 33/00*  (2006.01)
  *G01R 33/07*  (2006.01)
  (Continued)

(52) U.S. Cl.
  CPC ......... *G01R 33/07* (2013.01); *G01R 33/0029* (2013.01); *G01D 5/142* (2013.01);
  (Continued)

(58) Field of Classification Search
  CPC ...... G01R 33/077; G01R 33/07; G01R 33/06; G01R 21/08; G01R 15/202; G01R 15/20; G01D 5/142; G01D 5/2046; G01D 5/2053; B60W 2420/506; G06K 7/082; H05K 2201/086; Y10S 336/00; Y10S 505/87; E21B 47/02216; G01B 7/003
  (Continued)

(56) References Cited

U.S. PATENT DOCUMENTS 4,628,441 A * 12/1986 Johnstone ............ G05B 19/232
                                                        318/603
4,814,676 A *  3/1989 Van Hout ................. H02P 6/20
                                                      318/400.11

(Continued)

FOREIGN PATENT DOCUMENTS

DE   10 2004 010 613 A1   10/2005
DE   10 2006 052 692 B3    5/2008
DE   10 2012 020 515 A1    4/2013

*Primary Examiner* — Patrick Assouad
*Assistant Examiner* — Demetrius R Pretlow
(74) *Attorney, Agent, or Firm* — Muncy, Geissler, Olds & Lowe, P.C.

(57) ABSTRACT

A sensor unit for detecting an encoder at a predefined position, having a circuit device and a threshold signal present at the circuit device, and a magnetic field sensor. The magnetic field sensor has a supply and ground terminal and first and second outputs, and outputs an analog sensor signal that is dependent on the distance of the encoder, and a supply unit connected to the supply terminal of the magnetic field sensor, the supply unit having a control input, and the circuit device is connected to the magnetic field sensor. The circuit device is configured to provide the sensor signal as an amplified signal value, and the circuit device is configured to determine an amount from the difference between the amplified signal value and the threshold signal and to control the amplification of the signal value and the supply unit as a function of the magnitude of the amount.

23 Claims, 3 Drawing Sheets

(51) Int. Cl.
  *G01D 5/244* (2006.01)
  *G01R 33/09* (2006.01)
  *G01D 5/14* (2006.01)

(52) U.S. Cl.
  CPC ....... *G01D 5/2448* (2013.01); *G01D 5/24495* (2013.01); *G01R 33/09* (2013.01)

(58) Field of Classification Search
  USPC .... 324/207.2, 207.15–207.26, 251, 173–174
  See application file for complete search history.

(56) References Cited

U.S. PATENT DOCUMENTS

| | | | | |
|---|---|---|---|---|
| 5,801,462 | A * | 9/1998 | Yagoto | H02K 41/03 310/12.04 |
| 6,118,271 | A * | 9/2000 | Ely | H01F 13/003 324/207.17 |
| 7,825,657 | B2 | 11/2010 | Rossmann et al. | |
| 8,841,906 | B2 | 9/2014 | Heberle et al. | |
| 2005/0200367 | A1* | 9/2005 | Khaykin | G01D 5/2046 324/654 |
| 2007/0219733 | A1* | 9/2007 | Kawaguchi | G01D 5/2046 702/66 |
| 2011/0089930 | A1* | 4/2011 | Eckrich | G01D 3/063 324/76.77 |
| 2011/0187358 | A1* | 8/2011 | Eutebach | G01D 5/204 324/207.25 |
| 2012/0255164 | A1* | 10/2012 | Nakamura | G01D 3/0365 29/739 |
| 2013/0076351 | A1 | 3/2013 | Moon | |
| 2016/0216341 | A1* | 7/2016 | Boesch | G01R 33/032 |
| 2016/0356863 | A1* | 12/2016 | Boesch | G01R 33/032 |

* cited by examiner

SENSOR UNIT AND METHOD FOR DETECTING AN ENCODER AT A PREDEFINED POSITION

This nonprovisional application claims priority under 35 U.S.C. § 119(a) to German Patent Application No. 10 2016 009 353.6, which was filed in Germany on Aug. 3, 2016, and which is herein incorporated by reference.

BACKGROUND OF THE INVENTION

Field of the Invention

The present invention relates to a sensor unit having a magnetic field sensor for detecting an encoder at a predefined position and a method for detecting an encoder at a predefined position using a sensor unit.

Description of the Background Art

A current sensor and a method for detecting a currentless state are known from DE 10 2012 020 515 A1, which corresponds to U.S. Pat. No. 8,841,906, and which is incorporated herein by reference. A regulating system for a magnetic field sensor is known from DE 10 2004 010 613 A, which corresponds to U.S. Pat. No. 7,825,657, and in which the signals are prepared digitally by a processor.

SUMMARY OF THE INVENTION

It is therefore an object of the invention to provide a sensor unit having a magnetic field sensor and a method for detecting an encoder at a predefined position using a sensor unit.

In an exemplary embodiment, a sensor unit is provided having a magnetic field sensor and by a method is provided for detecting an encoder at a predefined position using a sensor unit.

According to an embodiment of the invention, a sensor unit is provided for detecting a sensor at a predefined position.

The sensor unit comprises a circuit device with a threshold value signal, present at the circuit device, and a magnetic field sensor, whereby the magnetic field sensor has a supply terminal and a ground terminal and a first output and a second output.

The magnetic field sensor outputs an analog sensor signal that is dependent on the distance of the sensor.

A supply unit is connected to the supply terminal of the magnetic field sensor, the supply unit having a control input.

The circuit device is connected to the magnetic field sensor, whereby the circuit device is configured to amplify the sensor signal and to provide the amplified sensor signal as a signal value. The circuit device is also configured to determine a control signal from the amount of the difference between the signal value and the threshold value signal and to control the amplification of the sensor signal and the supply unit as a function of the magnitude by means of the control signal.

The circuit device outputs a binary signal, whereby the value of the binary signal changes when the value of the signal value is greater than the threshold value signal and/or when the value of the signal value is smaller than the threshold value signal, in order to detect the encoder as being located at the predefined position based on the change in the binary signal.

According to an embodiment of the invention, a method is provided for detecting an encoder at a predefined position using a sensor unit, whereby the sensor unit has a circuit device and a threshold value signal is applied to the circuit device.

The sensor unit has a magnetic field sensor. The magnetic field sensor has a supply terminal and a ground terminal and a first output and a second output, whereby an analog sensor signal that is dependent on the distance of the encoder is generated by the magnetic field sensor.

The magnetic field sensor is connected to the supply unit via the supply terminal. The supply unit has a control input.

The circuit device is connected to the magnetic field sensor, whereby the sensor signal is amplified by the circuit device and provided as a signal value.

A control signal is provided by the circuit device, the control signal being determined from the amount of the difference between the signal value and the threshold value signal.

The supply unit and the amplification of the signal value are controlled by the circuit device as a function of the magnitude of the control signal.

The circuit device outputs a binary signal, the value of the binary signal being changed when the value of the signal value becomes greater than that of the threshold value signal and/or when the value of the signal value becomes smaller than the threshold value signal. The encoder is detected as being located at the predefined position based on the change in the binary signal.

It should be noted that the position of an encoder can be determined reliably and precisely with the sensor unit, whereby a magnetic flux and, in particular if there is a change in the encoder, a change in the flux in the magnetic field sensor are brought about by the encoder. A change in the binary output signal occurs if the sensor signal is large enough; i.e., the amplified sensor signal exceeds the threshold value signal.

Both ferromagnetic encoders and encoders with a permanent magnet can be used as encoders. In the case of a ferromagnetic encoder, the magnetic field of a so-called back-bias magnet is changed by the change in the position of the encoder and as a result a sensor signal is generated.

An advantage is that the distance of the encoder to the magnetic field sensor at a predefined position can be determined precisely using the sensor unit or the method. In particular the positional resolution in the vicinity of the predefined position relative to encoder positions more distant hereto is greatly increased.

Different sensitivity ranges can be achieved in a simple and cost-effective manner even with a single magnetic field sensor.

In an embodiment, the supply unit comprises a controllable voltage source or a controllable current source. The magnitude of the operating current or the magnitude of the supply voltage is set by means of the supply unit inversely proportional to the magnitude of the control signal, i.e., to the magnitude of the amount. Further, the amplification of the sensor signal is set inversely proportional to the magnitude of the control signal.

In other words, the magnetic field sensor is the more greatly supplied with current, the lower the control signal. In the case of a Hall sensor, the magnitude of the Hall voltage and the sensitivity can be increased as a result at a given magnetic flux.

An advantage is that in particular in a region distant from the predefined region the operating current or the magnitude of the supply voltage can be reduced relative to a region in the immediate vicinity to the predefined region. Tests have shown that current can be saved substantially thereby. The magnetic field sensor is supplied with a high operating current or with a high operating voltage only if it is desirable in the immediate vicinity of the predefined position.

In an embodiment, the magnitude of the control signal is proportional to the amount obtained from the difference of the signal value minus the threshold value signal.

In other words, the higher the amount, the higher the control signal.

In an embodiment, the magnitude of the threshold signal is changed. The predefined position can be changed as a result. In other words, the value of the binary signal changes only when the position of the encoder reaches the changed predefined position.

In an embodiment, the circuit device has a first controllable differential amplifier connected to the magnetic field sensor, the first differential amplifier comprising an output and a control input.

The circuit device comprises a second differential amplifier, whereby the second differential amplifier has a first input and a second input and an output.

The first input of the second differential amplifier is connected to the output of the first differential amplifier, whereby the threshold value signal is present at the second input of the second differential amplifier and the binary signal is present at the output of the second differential amplifier or is output by the second differential amplifier.

The circuit device comprises a circuit unit having a first input connected to the output of the first differential amplifier.

The signal value is present at the output of the first differential amplifier; in other words, the signal value is applied by the first differential amplifier to the first input of the circuit unit.

The circuit device comprises a second input. The threshold value signal is applied to the second input of the circuit unit.

The circuit unit comprises an output connected to the control input of the first differential amplifier and to the control input of the supply unit. The control signal is applied to the output of the circuit unit.

Further, the circuit unit is configured or the amount is determined from the difference by the circuit unit and the amount is applied to the output of the circuit unit as a control signal.

In an embodiment, the first differential amplifier and the second differential amplifier are formed as analog circuit units, or the first differential amplifier and the second differential amplifier are formed as digital circuit units, whereby in the case of the digital embodiment an analog-to-digital converter is looped in between the magnetic field sensor and the first differential amplifier. The first differential amplifier and the circuit unit preferably form an analog control circuit or a digital control circuit.

In an embodimnet, with the exception of the binary signal, the sensor unit only has analog signal processing at the output of the circuit device; i.e., the sensor signal, the amplified sensor signal, and the control signal are strictly analog signals. An advantage of analog signal processing is that the amplification can be changed rapidly.

Because the control occurs continuously and via an analog control signal, a complex and costly digitizing of the data and calculation using a processor are unnecessary. Furthermore, it is evident that the sensor unit and the method can be used very reliably and without errors.

In the analog embodiment, the first differential amplifier together with the circuit unit forms the analog control circuit. In other words, the analog sensor signal of the magnetic field sensor is amplified by the first controllable differential amplifier and applied to the circuit unit as an analog signal. The analog control signal is formed by the circuit unit and applied to the control input of the first differential amplifier, whereby the gain is reduced the more greatly, the smaller the difference between the amplified sensor signal and the threshold value signal.

In an embodiment, the magnitude of the gain of the first differential amplifier is or is set proportional to the magnitude of the control signal. In other words, the sensitivity of the magnetic field sensor is increased with a decreasing magnitude of the control signal and the gain is reduced.

In an embodiment, the first differential amplifier has a first input, connected to the first output of the magnetic field sensor, and a second input, connected to the second output of the magnetic field sensor. The sensor signal is applied between the two inputs.

In an embodiment, in the case of differential amplifiers the respective first inputs are formed as non-inverting inputs and the respective second inputs as inverting inputs.

It should be noted that the binary signal assumes a first value as long as the amplified sensor signal is lower than the threshold value signal and assumes a second value as long as the amplified sensor signal is higher than the threshold value signal. It is preferable that the first value of the binary signal is smaller than the second value.

The sensor unit can be monolithically integrated into a semiconductor substrate and comprises an evaluation circuit. It is understood that the evaluation circuit is connected to the circuit device and evaluates the binary signal in particular. The semiconductor substrate can be formed as a silicon semiconductor.

In an embodiment, the magnetic field sensor comprises a Hall sensor and/or an AMR sensor. It is understood that the magnetic field sensor can be designed as a 1D or 2D or 3D Hall sensor. In particular, the magnetic field sensor is designed as a Hall plate.

In an embodiment, the assignment of the terminals of the magnetic field sensor to the electrical functions is cyclically swappable by means of a changeover unit, in particular in order to improve the noise suppression. Such swapping can also be referred to as "spinning current."

The sensor unit or method may be used for a highly position-resolved detection of the precise position of an encoder in the vicinity of the predefined position, in particular for determining the exact position of the door or for determining the position of a pedal or the position of a flap in each case in the vicinity of the predefined position. For this purpose, the control signal is increased in the vicinity of the predefined position.

In an embodiment, the circuit device can be designed as a processor unit, the processor unit being configured to convert the analog sensor signal to a digital signal value.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
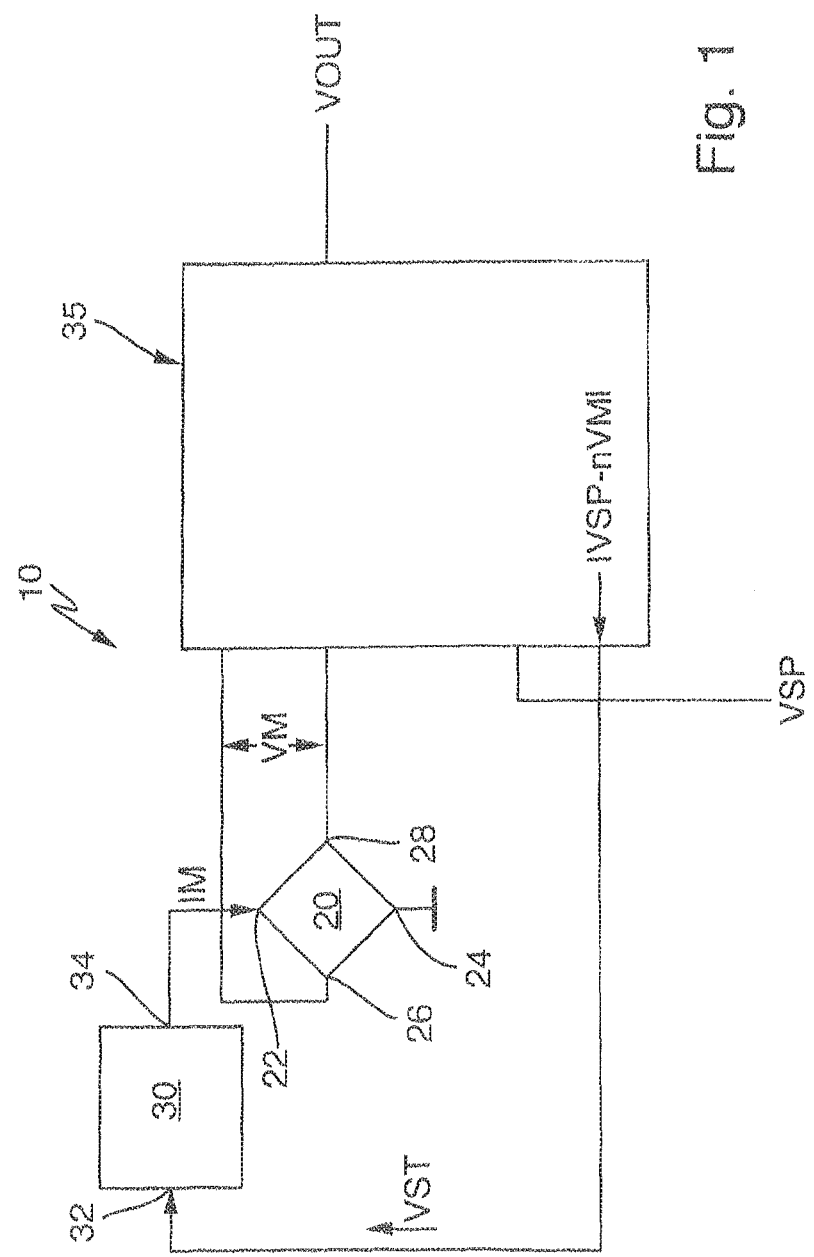
FIG. 1 shows an embodiment of a sensor unit of the invention.

The illustration in FIG. 1 shows a sensor unit 10 having a magnetic field sensor 20 and a supply unit 30, connected to magnetic field sensor 20, and a circuit device 35. Preferably, magnetic field sensor 20 comprises or consists of a Hall plate. Magnetic field sensor 20 has a first supply terminal 22 and a second supply voltage terminal 24, connected to a ground potential, and a first sensor output 26 and a second sensor output 28.

Supply unit 30 has a control input 32 and an output 34. Output 34 is connected to first supply terminal 22 of magnetic field sensor 20 and impresses an operating current IM into magnetic field sensor 20. Preferably, supply unit 30 comprises a current source or a voltage source.

The sensor signal VM is present between first sensor output 26 and second sensor output 28. The two sensor outputs 26 and 28 are connected to inputs of circuit device 35. Circuit device 35 has a further input for a threshold value signal VSP. Threshold value signal VSP is formed as a reference signal.

Circuit device 35 has an output for outputting a binary signal VOUT. Further, circuit device 35 has a control output. A control signal VST is applied to the control output by circuit device 35. The control output is connected to a control input 32 of supply unit 30.

Circuit device 35 is configured to amplify sensor signal VM and to provide it as the signal value nVM.

The control signal VST is determined by circuit device 35 as the amount of the difference between the signal value nVM and the threshold value signal VSP.

The amplification of the sensor signal VM is changed in an inversely proportional manner by the circuit device proportional to the magnitude of the amount and the operating current IM or the operating voltage.

The binary signal VOUT is output by circuit device 35, the value of the binary signal VOUT changing when the value of the signal value nVM becomes greater than the threshold value signal VSP and/or when the value of the signal value nVM becomes smaller than the threshold value signal VSP. The encoder can be detected as being located at the predefined position XO from the position of the change.

In one embodiment, the circuit device is designed as a processor unit. In this case, the present sensor signal is converted to a digital signal, preferably within the processor. It is understood that depending on the design, the control signal is output as an analog or digital signal.

Figure 2:
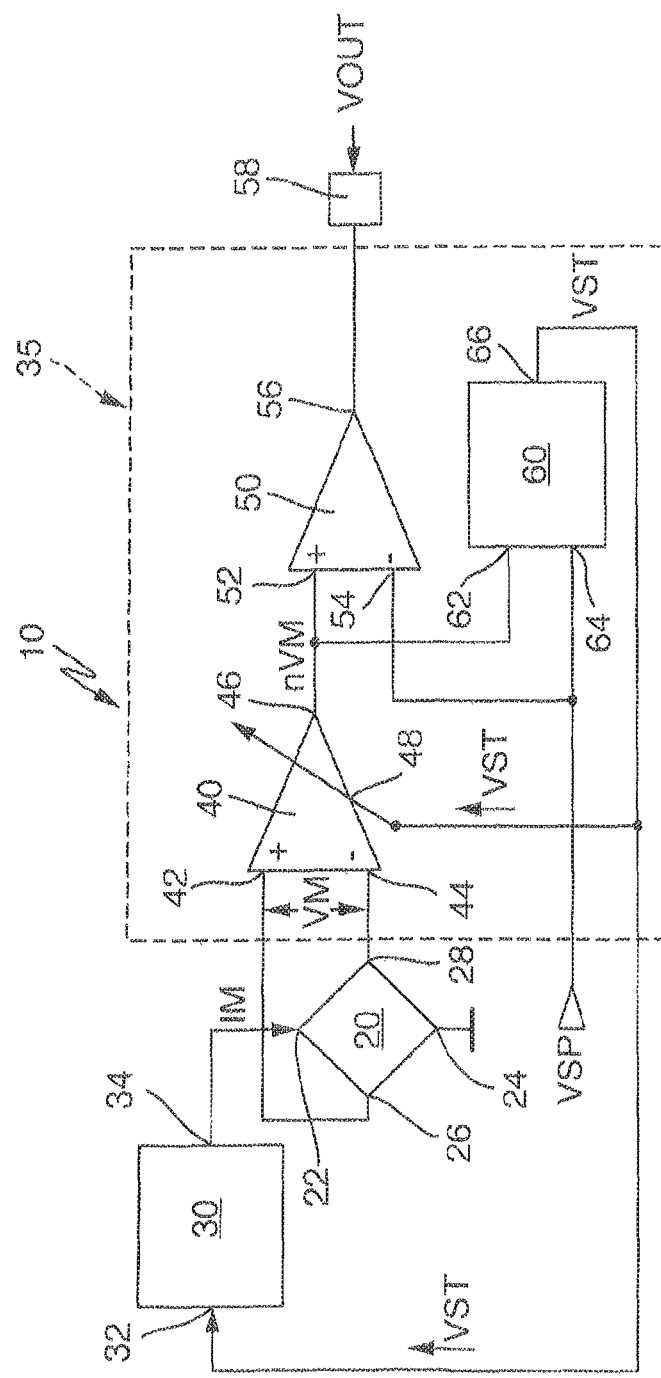
FIG. 2 shows a simplified circuit diagram of a sensor unit of the invention.

The illustration in FIG. 2 shows an analogous design of sensor unit 10. Only the differences in regard to the embodiment in FIG. 1 will be explained hereinbelow.

Circuit device 35, in an analogous design, comprises a first controllable differential amplifier 40. First differential amplifier 40 has a first input 42 and a second input 44 and an output 46 and a control input 48. First sensor output 26 is connected to first input 42 of first differential amplifier 40 and second sensor output 28 is connected to second input 44 of first differential amplifier 40. A sensor signal VM is applied to both inputs 42 and 44 of first differential amplifier 40.

The amplified analog sensor signal nVM is applied to output 46 of first differential amplifier 40.

Circuit device 35 has a second differential amplifier 50 with a first input 52 and a second input 54 and an output 56, first input 52 of second differential amplifier 50 being connected to output 46 of first differential amplifier 40.

The analog threshold value signal VSP is applied to second input 54 of second differential amplifier 50 in the form of a reference voltage. Output 56 of second differential amplifier 50 is connected to a signal output 58, a binary output signal VOUT being present at the signal output.

Sensor unit 10 also has a circuit unit 60 with a first input 62 and a second input 64 and with an output 66; here, first input 62 of circuit unit 60 is connected to output 46 of first differential amplifier 40 and second input 64 of circuit unit 60 has an input and the threshold value signal VSP is present at the input.

Output 66 of circuit unit 60, where the control signal VST is present, is connected to control input 48 of differential amplifier 40 and to control input 32 of supply unit 30. In this case, the control signal VST is formed by circuit unit 60 as the amount of the difference between the amplified sensor signal nVM minus the threshold value signal VSP. As a result, the control signal VST always has a positive sign.

The magnitude of the gain of first differential amplifier 40 is proportional to the magnitude of the control signal VST, whereas the magnitude of the operating current IM is inversely proportional to the magnitude of the control signal VST.

It is evident that first differential amplifier 40 and circuit unit 60 form an analog control circuit, supply unit 30 and magnetic field sensor 20 also being included subsequently.

It is understood that first differential amplifier 40 and second differential amplifier 50 can also be designed as a digital circuit unit. In this case, the sensor signal VM is digitized by means of an ADC. It is also understood that circuit unit 60 can be designed as an analog or a digital circuit unit.

FIGS. 3a to 3f show selected characteristic curves of sensor unit 10, illustrated in FIG. 1, as a function of a change in the position x of an encoder (not shown). In this case, the position x in the particular figures is plotted in each case as an x-axis, the predefined position being indicated by XO.

Figure 3A:
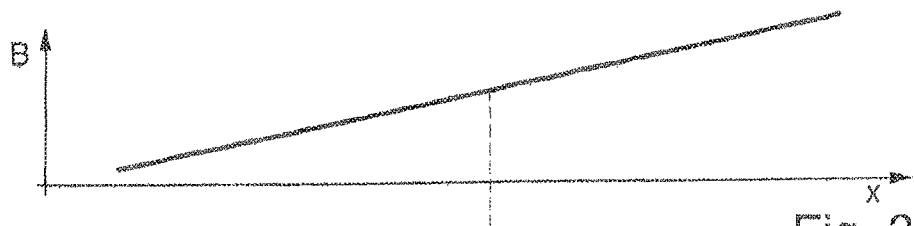
FIGS. 3a-f show a number of characteristic curves as a function of the change in the position of an encoder of the sensor unit illustrated in FIG. 1 or in FIG. 2.

A strength of the magnetic field B at the position of magnetic field sensor 20 is plotted as the y-axis in FIG. 3a. It is evident that the strength of the magnetic field B increases with an increasing x-value; i.e., the distance to magnetic field sensor 20 decreases.

It is understood that, for reasons of clarity, the increase in the magnetic field B is shown linearly. However, a multiplicity of other curve shapes results depending on the encoder/sensor unit arrangement.

Figure 3B:
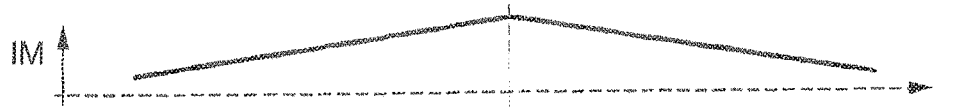

In FIG. 3b, the magnitude of the operating current IM through magnetic field sensor 20, preferably embodied as a Hall plate, is represented as the y-axis. It is evident that the operating current IM and, as a result, the magnetic sensitivity of magnetic field sensor 20 are at their maximum at the predefined position XO and decrease both toward small and large x values.

It is understood that, for reasons of clarity, the change in the operating current IM is shown linearly. However, a multiplicity of other curve shapes results depending on encoder/sensor unit arrangement.

Figure 3C:
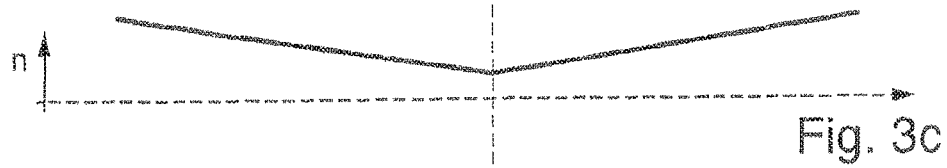

FIG. 3c shows the magnitude of the gain factor n of first differential amplifier 40 as the y-axis. It is evident that at the predefined position XO the gain factor n is minimal and the gain factor n increases both toward small and large x values.

It is understood that, for reasons of clarity, the change in the gain factor n is shown linearly. However, a multiplicity of other curve shapes results depending on the encoder/sensor unit arrangement.

Figure 3D:
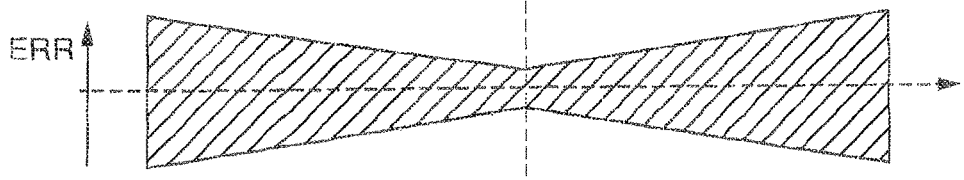

In FIG. 3d, the magnitude of the error range ERR of the output signal nVM of first differential amplifier 40 is shown as the y-axis. It is evident that the size of the error range ERR is minimal at the predefined position XO and the size of the error range ERR increases both toward small and large x values.

It is understood that, for reasons of clarity, the change in the size of error range ERR is shown linearly. However, a multiplicity of other curve shapes results depending on the encoder/sensor unit arrangement.

Figure 3E:
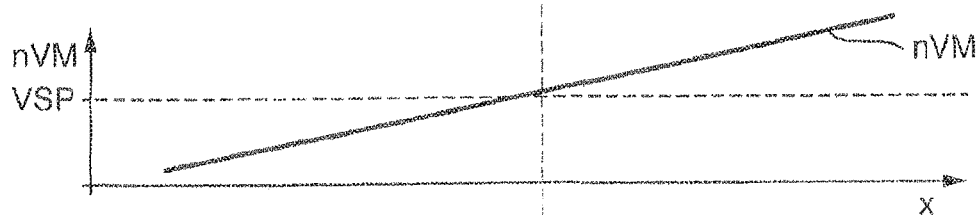

In FIG. 3e, the magnitude of the amplified output signal nVM of first differential amplifier 40 is shown as the y-axis. It is evident that the output signal nVM increases and is equal in magnitude to the threshold value signal VSP at the predefined position XO and then increases further.

It is understood that, for reasons of clarity, the change in the amplified output signal nVM is shown linearly. However, a multiplicity of other curve shapes results depending on the encoder/sensor unit arrangement.

Figure 3F:

In FIG. 3f, the magnitude of the binary signal VOUT at signal output 58 is shown as the y-axis. It is evident that the binary signal VOUT jumps from a first low value to a second higher value at the predefined position XO.

It is understood that with a reduction of the threshold value signal VSP in particular, the predefined location shifts to smaller x-values and vice versa.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A sensor unit for detecting an encoder at a predefined position, the sensor unit comprising:
   a circuit device;
   a magnetic field sensor having a supply terminal and a ground terminal and a first output and a second output, the magnetic field sensor being adapted to output an analog sensor signal that is dependent on a distance from the encoder; and
   a supply unit connected to the supply terminal of the magnetic field sensor, the supply unit having a control input,
   wherein the circuit device is connected to the magnetic field sensor, the circuit device being configured to amplify the sensor signal and to provide it as a signal value,
   wherein the circuit device is configured to determine a control signal from an amount based on a difference between the signal value and a threshold value signal and configured to control the amplification of the sensor signal and the supply unit as a function of a magnitude of the control signal, and
   wherein the circuit device is configured to output a binary signal, a value of the binary signal changing, in each case, when a value of the signal value is greater than the threshold value signal and/or when the value of the signal value is smaller than the threshold value signal to detect the encoder as being located at the predefined position based on a change in the binary signal.

2. The sensor unit according to claim 1, wherein the supply unit comprises a controllable voltage source or a controllable current source.

3. The sensor unit according to claim 1, wherein, in the case of the supply unit, a magnitude of the operating current or a magnitude of the supply voltage is inversely proportional to a magnitude of the control signal and an amplification is proportional to the magnitude of the control signal.

4. The sensor unit according to claim 1, wherein a magnitude of the control signal is proportional to an amount obtained from a difference from the signal value minus the threshold signal.

5. The sensor unit according to claim 1, wherein the circuit device comprises:
   a first controllable differential amplifier connected to the magnetic field sensor, the first controllable differential amplifier having an output and a control input; and
   a second differential amplifier having a first input and a second input and an output, the first input of the second differential amplifier being connected to the output of the first differential amplifier, and the threshold value signal being adapted to be provided at the second input of the second differential amplifier, and the binary signal being adapted to be provided at the output of the second differential amplifier; and
   a circuit unit having a first input connected to the output of the first differential amplifier, wherein the signal value is adapted to be provided at the output of the first differential amplifier, and having a second input connectable to the threshold value signal,
   wherein the circuit unit has an output connected to the control input of the first differential amplifier and to the control input of the supply unit, and
   wherein the circuit unit is configured to determine the amount from the difference and to apply the amount to the output of the circuit unit as the control signal.

6. The sensor unit according to claim 5, wherein the first differential amplifier and the second differential amplifier are analog circuit units, or wherein the first differential amplifier and the second differential amplifier are formed as digital circuit units and an analog-to-digital converter is looped between the magnetic field sensor and the first differential amplifier.

7. The sensor unit according to claim 5, wherein the first differential amplifier and the circuit unit form an analog control circuit or a digital control circuit.

8. The sensor unit according to claim 5, wherein a magnitude of the gain of the first differential amplifier is inversely proportional to a magnitude of the control signal.

9. The sensor unit according to claim 5, wherein the first differential amplifier has a first input connected to the first output of the magnetic field sensor and a second input connected to the second output of the magnetic field sensor, and wherein the sensor signal is adapted to be provided between the two inputs.

10. The sensor unit according to claim 5, wherein the first inputs are formed as non-inverting inputs and the second inputs as inverting inputs.

11. The sensor unit according to claim 1, wherein the sensor unit is monolithically integrated into a semiconductor substrate, and wherein the sensor unit comprises an evaluation circuit.

12. The sensor unit according to claim 1, wherein the magnetic field sensor comprises a Hall sensor and/or an AMR sensor.

13. The sensor unit according to claim 1, wherein the magnetic field sensor comprises a Hall plate.

14. The sensor unit according to claim 1, wherein the assignment of the terminals of the magnetic field sensor to the electrical functions is cyclically interchangeable via a changeover unit to improve the noise suppression.

15. The sensor unit according to claim 1, wherein the circuit device is a processor unit, and wherein the processor unit is configured to convert the analog sensor signal to a digital signal value.

16. A method for detecting an encoder at a predefined position via a sensor unit, the method comprising:
   providing a circuit device;
   applying a threshold value signal to the circuit device;
   providing a magnetic field sensor having a supply terminal and a ground terminal and a first output and a second output;
   generating an analog sensor signal by the magnetic field sensor that is dependent on a distance of the encoder;
   connecting a supply unit to the magnetic field sensor, the supply unit having a control input;
   connecting the circuit device to the magnetic field sensor;
   amplifying the sensor signal by the circuit device and providing a signal value;
   providing a control signal by the circuit device, the control signal being determined from an amount of a difference between the signal value and the threshold value signal (VSP);
   controlling, via the circuit device, the supply unit and the amplification of the sensor signal as a function of a magnitude of the control signal; and
   outputting, via the circuit device, a binary signal, wherein a value of the binary signal is changed when a value of the signal value becomes greater than that of the threshold value signal and/or when the value of the signal value becomes smaller than the threshold value signal, in order to detect the encoder as being located at the predefined position based on a change in the binary signal.

17. The method for detecting an encoder at a predefined position according to claim 16, wherein the supply unit comprises a voltage source or a current source and a magnitude of the operating current or a magnitude of the supply voltage is set inversely proportional to the magnitude of the control signal, and wherein the amplification of the sensor signal is set proportional to the magnitude of the control signal.

18. The method for detecting an encoder at a predefined position according to claim 16, wherein the predefined position is changed with the magnitude of the threshold value.

19. The sensor unit for detecting an encoder at a predefined position according to claim 16, wherein the magnitude of the control signal is set proportional to an amount obtained from the difference of the signal value minus the threshold value signal.

20. The method for detecting an encoder at a predefined position according to claim 16,
   wherein the circuit device has a first controllable differential amplifier connected to the magnetic field sensor,
   wherein the amplified sensor signal is generated by the first differential amplifier and the first differential amplifier has an output and a control input, and
   wherein a second differential amplifier is provided,
   wherein the second differential amplifier has a first input and a second input and an output and the first input of the second differential amplifier is connected to the output of the first differential amplifier and the threshold value signal is applied to the second input of the second differential amplifier, and the binary signal is output by the output of the second differential amplifier, and
   wherein a circuit unit having a first input connected to the output of the first differential amplifier is provided and the signal value is applied to the first input of the circuit unit, and the circuit unit has a second input and the threshold value signal is applied to the second input and the circuit unit has an output connected to the control input of the first differential amplifier and to the control input of the supply unit, and
   wherein the amount is determined by the circuit unit and the amount is applied as the control signal to the output of the circuit unit.

21. The method for detecting an encoder at a predefined position according to claim 20, wherein the gain of the first differential amplifier is set proportional to the magnitude of the control signal.

22. The method for detecting an encoder at a predefined position according to claim 16, wherein a location of the predefined position is changed with the magnitude of the threshold signal.

23. The method for detecting an encoder at a predefined position according to claim 16, wherein the method increases a position-resolved detection of the precise position of an encoder in the vicinity of the predefined position relative to encoder positions more distant from the predefined position.

* * * * *